United States Patent Office
3,554,752
Patented Jan. 12, 1971

3,554,752

LIGHT-SENSITIVE REPRODUCTION MATERIAL

Ernst-August Hackmann, Roland Dietrich, Roland Moraw, Wiesbaden-Biebrich, Germany, assignors to Kalle Aktiengesellschaft, Wiesbaden-Biebrich, Germany, a corporation of Germany No Drawing. Filed Nov. 7, 1966, Ser. No. 592,293
Claims priority, application Germany, Nov. 10, 1965, K 57,619
Int. Cl. G03c *1/52*
U.S. Cl. 96—90 3 Claims

ABSTRACT OF THE DISCLOSURE

Light-sensitive imaging material comprises a support and a coating thereon of a composition comprising a halogenated hydrocarbon which splits off halogen when exposed to light, an N-vinyl compound selected from the group of N-vinyl amines, N-vinyl amides, and N-vinyl imides, and a sensitizer which is a merocyanine dye. The fixing of images resulting directly from imagewise light exposure of the negative-working imaging material is effected by washing the material with a solvent for the sensitizing dye, for example with a petroleum ether.

The present invention is concerned with novel reproduction material the light-struck areas of which become visible without further intensification. Upon exposure of the reproduction material under a master, a copy with reversed tone values is obtained.

It is known to use merocyanine dyestuffs for making silver halide-containing reproduction layers sensitive to light in the visible and the infra-red region of the spectrum.

Further, it is known that the colour of merocyanine dyestuffs changes when they are exposed to light in the presence of organic halogen compounds and that the solubility characteristics of the exposed areas change at the same time. This effect has already been utilized for reproduction purposes. Thus from U.S. patent specification No. 3,106,466, a reproduction material consisting of a support and a light-sensitive layer disposed thereon is known, the light-sensitive layer of which contains a merocyanine dyestuff of a certain class and a halogenated hydrocarbon which splits off halogen when exposed to light. If this reproduction material is image-wise exposed, a change of colour occurs in the image areas.

For fixation, the exposed layer is washed with a suitable solvent, e.g. light petroleum ether. Thereby, the initial dyestuffs and the residual halogen compound are removed, while the dyestuff formed by exposure remains undissolved on the support. Thus, if the surface of the support used is colourless, a coloured copy on a colourless background is obtained after the washing process. However, the reproduction layers of these materials are relatively insensitive to light, so that long exposure times and light sources of high intensity are required for the formation of images. For these reasons, reproduction materials containing layers of merocyanine dyestuffs and halogen compounds have not become widely used in practice.

Further, reproduction materials are known the light-sensitive layers of which consist essentially of an N-vinyl compound and an organic halogen compound which splits off halogen when exposed to light. Layers containing N-vinyl carbazole and tetrabromomethane are preferably used. Upon image-wise exposure of these layers, a latent, invisible image is formed. This latent image is made visible by a brief heating step. By this heating step, a dyestuff is formed in the exposed areas, so that a copy of the original with reversed tone values is obtained. Reproduction materials of this kind are also suitable for the reproduction of directly legible copies. A detailed description of their composition and processing is contained, for example, in U.S. patent specification No. 3,042,519. However, the light-sensitivity of this material is also rather low. Moreover, the the quality of the images produced, as far as sharpness and contrast are concerned, is not sufficient to enable this material to compete with other reproduction materials already on the market. However, these materials do have the advantage that the dyestuff formed is very fast to daylight.

The light-sensitive reproduction material of the present invention consists of a support and a light-sensitive layer disposed thereon which, in principle, is a combination of the components of the two light-sensitive systems mentioned above, viz. N-vinyl compound/organic halogen compound and merocyanine dyestuff/organic halogen compound.

The layer contains essentially the following three components:

(1) At least one merocyanine dyestuff of the general formula:

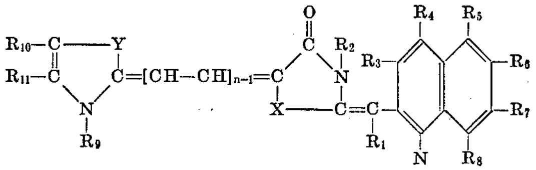

in which:

$n$ stands for an integer from 1 to 4, $R_1$ stands for hydrogen, or a cyan or alkyl residue with up to 4 carbon atoms, $R_2$ stands for hydrogen or a straight-chained for branched alkyl residue with up to 4 carbon atoms, $R_3$, $R_4$, $R_5$, $R_6$, $R_7$, $R_8$, which may be the same or different, each stand for hydrogen, halogen, cyanide or amino groups which may be alkyl-substituted, or alkyl groups with up to 4 carbon atoms, or nitro-groups, or may be closed to form a ring when they are in neighbouring positions, $R_9$ stands for hydrogen or a straight-chained or branched alkyl residue with up to 4 carbon atoms, $R_{10}$ and $R_{11}$, which may be the same or different, each stand for hydrogen, alkyl residues with up to 4 carbon atoms, or may unite to form a condensed benzene ring, X stands for oxygen, sulphur, >NH, N-alkyl with up to 4 carbon atoms, or the grouping:

$$-\overset{\overset{\displaystyle O}{\|}}{C}-\overset{\overset{\displaystyle CH_3}{|}}{N}-$$

and

Y stands for oxygen, sulphur, selenium, or an ethylene group, (2) At least one N-vinyl amine and/or N-vinyl amide and/or N-vinyl imide, and (3) At least one halogenated hydrocarbon which splits off halogen when exposed to light.

The reproduction material of the present invention possesses a higher light-sensitivity than the above-described known reproduction materials, in combination with the favourable properties of the two systems described, i.e. the intensive colouration and good contrast of the merocyanine/halogen compound layers and the good stability of the copies obtained from layers containing N-vinyl compounds. Moreover, the light-sensitivity of the new reproduction material is essentially in the visible region of the spectrum and high enough to permit exposure using commercial projectors. The latter requirement is essential since negative-working reproduction materials are preferably used for the processing of negative originals, because positive copies are directly obtained. Negative originals are available in large numbers in the form of microfilms or transparent supports. Numerous commercial re-enlargement devices are adapted to the use of such microfilms.

The compounds corresponding to the formulae set forth in the following table designated as Dyestuffs Nos. 1 to 10, have proved to be particularly suitable merocyanine dyestuffs.

Dyestuff No. 1

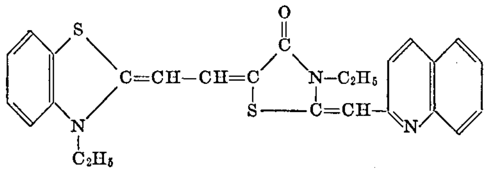

Dyestuff No. 2

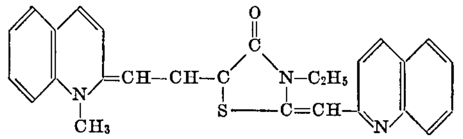

Dyestuff No. 3

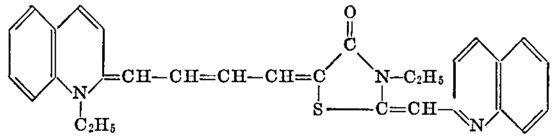

Dyestuff No. 4

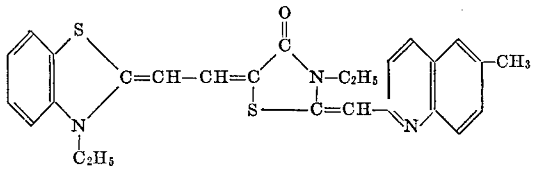

Dyestuff No. 5

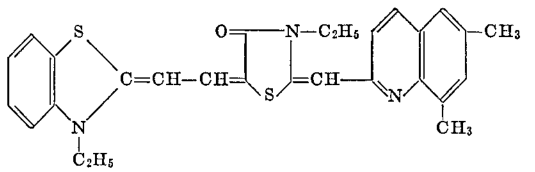

Dyestuff No. 6

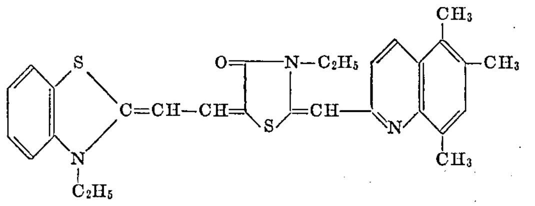

Dyestuff No. 7

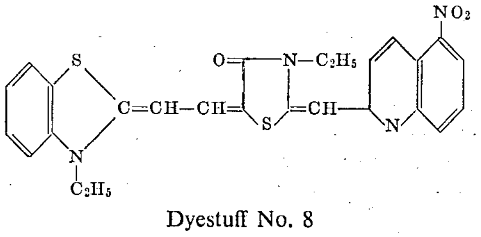

Dyestuff No. 8

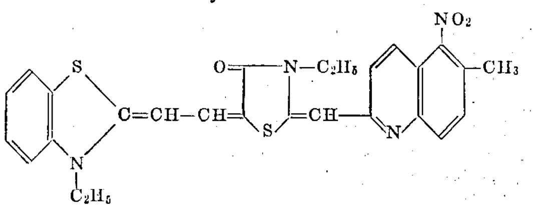

Dyestuff No. 9

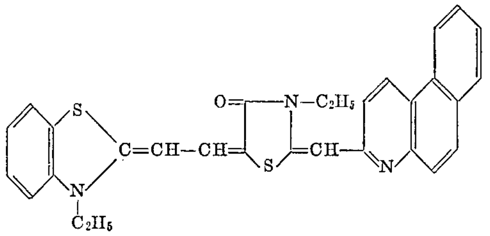

Dyestuff No. 10

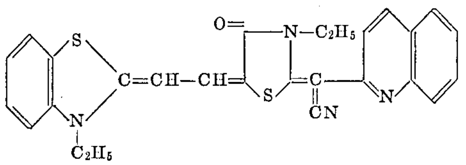

The preparation of such merocyanine compounds is known and has described, for example, in U.S. patent specification No. 3,109,736. However, other methods of synthesis than those described in this patent specification are also possible.

The following compounds are given as examples of the N-vinyl-amines, N-vinyl amides and N-vinyl imides to be used in the light-sensitive layer of the reproduction material according to the invention:

N-vinyl-carbazole, 3,6-dimethyl-N-vinyl-carbazole, N-vinyl-N-methyl-acetamide, N-vinyl-pyrrolidone, N-vinyl-succinimide, N-vinyl-phthalimide, N-vinyl-caprolactam, N-vinyl-N-methyl - methane - sulphonamide, N-vinyl-N-methylpropionic acid amide, N-vinyl-N-ethyl-acetamide, N-vinyl-N-isopropylacetamide, N-vinyl-benzimidazole, N-vinyl-N-methyl-benzamide, N-vinyl-acetanilide, N-vinyl-N-methyl-dibenzylacetamide, N-vinyl-imidazole, N-vinyl-tert.-butyl carbamate. These componds may be used either individually or in admixture with one another.

Within the class of compounds generally defined above as halogen compounds which split off halogen upon exposure, the following deserve particular mention: tetrabromomethane, pentabromomethane, iodoform, tribromo-methyl-phenyl-sulphone, and $\omega,\omega,\omega$-tribromo-acetophenone which is substituted once or several times in the aromatic ring by halogen, or alkoxy, alkyl or nitro groups, such as 3-nitro-$\omega,\omega,\omega$-tribromoacetophenone. Tetrabromopyrrol and tetraiodopyrrol, tetraiodothiophen and tetrabromothiophen, hexachloroethane and tetraiodomethane are also suitable. These compounds may also be contained, either individually or in admixture with one another, in the light-sensitive layer of the reproduction material according to the present invention.

The proportions of the various components in the layer may vary within wide limits. Particularly good results are obtained when 0.001 to 0.1 part by weight of merocyanine dyestuff is used per part by weight of N-vinyl compound. If smaller quantities are included, a distinct effect of the merocyanine dyestuffs can still be observed, but this effect is generally not strong enough to enable reproduction materials containing such quantities of merocyanine dyestuffs to be used in the field of microfilm re-enlargement. Without trying to give a theoretical explanation of the light-reaction taking place in the layer, this proves that no ordinary sensitizing effect of the merocyanine dyestuffs plays the essential part in the formation of the image, but that the merocyanine dyestuff itself is an essential component of the intensively coloured dyestuff formed by exposure to light. The quantity of the halogen compound contained in the layer may vary within even wider limits. Best results are obtained when 0.1 to 10 parts by weight of the light-sensitive halogen compound are contained in the layer per part by weight of N-vinyl compound. Larger quantities of halogen compound show no noticeable advantage, they only serve to render the material more expensive. They are, however, not necessarily disadvantageous.

The layer of the reproduction material according to the present invention is coloured in the colour of the merocyanine dyestuff contained therein. For instance, it is red if it contains Dyestuff No. 1. When the reproduction material is image-wise exposed, a colour change of the layer, in most cases an intensification of the colour shade, occurs in the exposed areas. Moreover, the exposed areas undergo a change as regards solubility. Whereas the unexposed reproduction layer dissolves easily, for example in light petroleum ether or similar liquid hydrocarbons, the exposed areas are completely insoluble in such solvents. As a result, fixation of the image-wise exposed reproduction material may be effected by lightly wiping the exposed layer with a cotton pad soaked in light petroleum ether. By this treatment, the unexposed areas are removed and the surface of the support used for the reproduction layer becomes visible.

The spectral sensitivity of the materials is substantially in the same range as the range of absorption of the merocyanine dyestuffs used. Since the maximum absorption of the merocyanine dyestuffs shifts into the longer wave range with an increasing length of their conjugate chain, reproduction layers for the whole spectral range of visible light and even for the short-wave portion of the infra-red range may be produced. Therefore, reproduction material of the present invention can also be processed in thermographic reproduction apparatus. It is noteworthy that the combined application of heat rays and perceptible heat causes a marked increase in the rate of dyestuff formation. This also permits an adaptation of the sensitivity of the layers to the spectral wave ranges emitted by different light sources.

The most conspicuous characteristic of the novel reproduction material, however, is the fact that its light-sensitivity is considerably higher than the sum of those of the individual components which it contains. A direct comparison of the light-sensitivity of known materials with that of the material according to the invention is difficult, since the former are either sensitive to the ultra-violet range of light only, or contain other mercocyanine dyestuffs which permit of no direct comparison. However, the light-sensitivity of the reproduction material according to the invention is such that an exposure in commercial re-enlargement devices, with acceptable exposure times, is possible. The light-sensitivity of the two kinds of known materials mentioned above is far from being sufficient for this purpose. However, the material of the present invention is not limited to the use for re-enlargement, contact copies may also be prepared from it.

The light-sensitive reproduction material according to the present invention is prepared in the customary manner. A solution which contains at least one merocyanine dyestuff, at least one N-vinyl compound and at least one halogen compound, in an organic solvent, is applied to a suitable support. Acetone is the most suitable solvent. The layer may be applied in the usual manner by whirl-coating or other coating methods. Suitable among the latter are the known dip-coating and roller-coating methods. The conditions under which the freshly coated layers are freed from the solvent used depend on the evaporation characteristics of the solvent and the halogen compound present. The drying temperautre must be selected such that the solvent evaporates but not the halogen compound. When relatively low drying temperatures need to be applied, a correspondingly increased circulation of air over the layer must be caused in order to increase the rate of evaporation of the solvent.

When the solvent cannot be removed without evaporating a substantial proportion of the halogen compound, or when the reproduction material is to be stored for a particularly long time before it is used, it is advisable only to introduce the halogen compound of the light-sensitive system into the layer shortly before the material is used.

This can be effected by causing a suitable volatile halogen compound, e.g. tetrabromomethane, to diffuse into the layer immediately preceding exposure. Further it is possible to bring the halogen-free layer into intimate contact with a substance saturated with a halogen compound, for example with a correspondingly impregnated paper or felt web which passes through a supply tank containing the halogen compound and thus constantly replenishes itself with the halogen compound. The general method according to which tetrabromomethane is introduced into such a layer shortly before the material is exposed is known from French patent specification No. 1,221,064.

Suitable supports for the light-sensitive layer are constituted by all those sheet-like materials customarily used in the reproduction field, such as metal foils and plastics films, glass, wood, textiles and films of cellulose derivatives, but preferably, paper. For better adhesion of the light-sensitive layer to smooth supporting materials these may be provided with a precoat. Advantageously, such a precoat consists of a pigment, e.g. finely ground alkaline earth metal sulphates, dispersed silica, powdered silicates, such as kaolin, insoluble starch and finely divided aluminium oxide, magnesium oxide or titanium dioxide. The pigments are generally applied to the support in a binder.

Suitable binders are, for example, polyvinyl acetate, casein starch mucilage, carboxymethyl cellulose, carboxymethyl amylose and certain copolymers of acrylic acid, for example with vinyl chloride, styrene or other vinyl compounds.

Processing of the reproduction material is carried out in the conventional manner. It is exposed in contact with a master or by projection. An image is thus produced which is already visible. Negative originals are preferred because the reproduction material of the invention reverses the tone values of thus gives a positive copy. Fixation is required after exposure, since the unexposed areas are still sensitive to light.

As has already been stated, fixation is effected most simply by removing excess merocyanine dyestuff, N-vinyl compound and halogen compound with petroleum ether. After a short drying step, the copy is ready for use. No heating is required.

The preparation and use of the reproduction material according to the invention are illustrated by the following examples:

EXAMPLE 1

1 g. of N-vinyl carbazole and 12.5 mg. of Dyestuff No. 1 (see formulae drawings) are dissolved in 10 ml. of acetone and then 1 g. of one of the halogen compounds mentioned below is added. The solution is poured onto baryta paper. After evaporation of the solvent, a re-enlargement on a scale of 1:10 is produced on the resulting material from a silver film negative by means of a 500 watt Leitz slide projector. The following table contains the various exposure times which are required in the case of each halogen compound to produce a strong image of the original used:

| Halogen compound: | Exposure in seconds |
|---|---|
| Tetrabromomethane | 2 |
| m-Nitro-ω,ω,ω-tribromoacetophenone | 5 |
| 2,5-dimethyl-ω,ω,ω-tribromoacetophenone | 5 |
| Bromoform | 15 |
| Iodoform | 15 |
| Pentabromoethane | 15 |
| 1,2-dibromo-1,1,2,2-tetrachloroethane | 15 |

Subsequently, fixation is effected by washing with light petroleum ether. Red images on a colourless background are obtained.

EXAMPLE 2

1 g. of N-vinyl carbazole and 12.5 mg. of Dyestuff No. 1 are dissolved in 10 ml. of acetone and the solution is then poured onto baryta paper. After evaporation of the solvent, the coated papers are suspended in a constant-temperature chamber in which a supply of tetrabromomethane is kept in an open vessel. Images of the same intensity of colour as those produced in accordance with Example 1 are obtained when the papers are left in a constant-temperature chamber, for 2 minutes at 20° C. or
for 30 seconds at 35° C. or
for 20 seconds at 40° C. with an exposure time of 15 seconds, or
for 25 second at 45° C. or
for 15 seconds at 50° C. or
for 10 seconds at 60° C. or
for 5 seconds at 70° C. with an exposure time of 5 seconds.

EXAMPLE 3

1 g. of N-vinyl carbazole, 1 g. of tetrabromomethane and 12.5 mg. of Dyestuff No. 1 are dissolved in 10 ml. of acetone and a transparent paper is soaked with this solution. A re-enlargement is made by the method described in Example 1. The exposure time is 15 seconds. The material is then washed with petroleum ether. A strong red image is obtained. From the intermediate original thus produced, 50 copies can be made on photoprinting paper without any falling off in the quality of the prints made.

EXAMPLE 4

12.5 mg. of Dyestuff No. 1, 1 g. of tetrabromomethane and 1 g. of one of the N-vinyl compounds listed below are dissolved in 10 ml. of acetone. A baryta paper is coated with this solution and on the light-sensitive paper thus prepared a re-enlargement is made by the method of Example 1. For comparison purposes, a re-enlargement is also produced on a baryta paper containing only 12.5 mg. of Dyestuff No. 1 and 1 g. of tetrabromomethane.

With an exposure of 5 seconds, a very strong image is obtained from papers containing one of the following vinyl compounds:

N-vinyl-N-methyl-acetamide,
N-vinyl-pyrrolidone,
N-vinyl-succinimide,
N-vinyl-phthalimide,
N-vinyl-caprolactam,
N-vinyl-N-methyl-methane sulphonamide.

The images produced in this manner are much stronger than the reference samples exposed for the same time. Markedly better than the reference samples are also the images obtained with layers containing the following N-vinyl compounds:

N-vinyl-N-methyl-propionic acid amide,
N-vinyl-N-ethyl-acetamide,
N-vinyl-N-isopropyl-acetamide.

EXAMPLE 5

A solution containing 1 g. of N-vinyl carbazole, 1 g. of tetrabromomethane and 12.5 mg. of Dyestuff No. 1 in 10 ml. of acetone is poured onto baryta paper. After evaporation of the solvent, a re-enlargement on the scale 1:13 is produced on the resulting material using a commercial reader printer, such as "Tusca Systematic" manufactured by Tausch and Simon and equipped with a projector lamp of 24 volt/200 watt capacity having lateral mirrors. Exposure time is 15 seconds. After washing with petroleum ether, a clearly legible red image is obtained on an almost colourless background.

EXAMPLE 6

A baryta paper is coated with a solution of 250 mg. of tetrabromomethane, 500 mg. of N-vinyl carbazole and 12 mg. of Dyestuff No. 1 in 10 ml. of methylene chloride and then dried. The coated sheet is then placed with the coated side upwards, covered with a negative original, and put into a nylon gauze wrapper customarily used in thermographic processes. A copy is then produced in a commercial thermographic apparatus at the highest possible rate of feed, with the layer side of the material facing the infra-red burner. After washing with ligroin, an image that is very rich in contrast is obtained on a pure white background.

EXAMPLE 7

In a series of preparations, 1 g. of N-vinyl carbazole and 1 g. of tetrabromomethane are dissolved in 10 ml. of acetone and 25 mg. are added of a different one of the dyestuffs numbered 4 to 10 in each case. The resulting solutions are poured onto baryta paper and, after evaporation of the solvent, in each case a re-enlargement on the scale 1:10 is produced from a silver film negative by means of a 500 watt Leitz slide projector. The following table contains the exposure times required to produce, after fixation with petroleum ether, a strong, red image of the master.

| Dyestuff: | Exposure in seconds |
|---|---|
| No. 4 | 1 |
| No. 5 | 3 |
| No. 6 | 5 |
| No. 7 | 2 |
| No. 8 | 5 |
| No. 9 | 1 |
| No. 10 | 5 |

EXAMPLE 8

The procedure described in Example 7 is repeated, replacing tetrabromomethane by tribromo-methyl-phenyl-sulphone. The following exposure times are required:

| Dyestuff: | Exposure in seconds |
|---|---|
| No. 4 | 1 |
| No. 5 | 1 |
| No. 6 | 1 |
| No. 7 | 2 |
| No. 8 | 5 |
| No. 9 | 0.5 |
| No. 10 | 3 |

The above examples have been presented for the purpose of illustration and should not be taken to limit the scope of the present invention. It will be apparent that the described examples are capable of many variations and modifications which are likewise to be included within the scope of the present invention as set forth in the appended claims.

What is claimed is:

1. Light-sensitive reproduction material comprising a support and a light-sensitive composition comprising:
(a) an N-vinyl compound;
(b) a halogenated hydrocarbon which splits off halogen when exposed to light; and
(c) a merocyanine dye of the general formula:

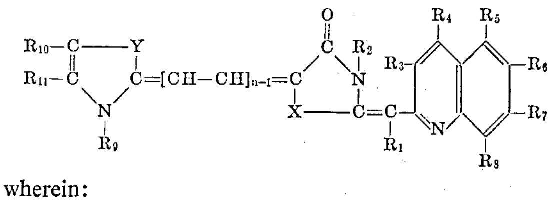

wherein:

$R_1$ is hydrogen, or a cyan or alkyl residue with up to 4 carbon atoms;
$R_2$ is hydrogen, or a straight-chained or branched alkyl residue with up to 4 carbon atoms;
$R_3$, $R_4$, $R_5$, $R_6$, $R_7$, $R_8$ are individually hydrogen, halogen, a cyanide or amino group which may be alkyl-substituted, an alkyl group with up to 4 carbon atoms, a nitro group, or may be united when in neighbouring positions to form a closed ring;
$R_9$ is hydrogen, or a straight-chained or branched alkyl residue having up to 4 carbon atoms;

$R_{10}$, $R_{11}$ are individually hydrogen or an alkyl residue with up to 4 carbon atoms, or may be united to form a closed ring;

X is oxygen, sulphur, >NH, N-alkyl with up to 4 carbon atoms, or the grouping:

$$-\overset{\overset{\displaystyle O}{\|}}{C}-\overset{\overset{\displaystyle CH_3}{|}}{N}-$$

selected from the group consisting of N-vinyl amines, N-vinyl amides and N-vinyl imides.

Y is oxygen, sulphur, selenium, or an ethylene group; and *n* is an integer from 1 to 4.

2. Material according to claim 1 wherein said composition comprises about 0.001 to 0.1 part by weight of merocyanine dye and about 0.1 to 10.0 parts by weight of light-sensitive halogen compound per part by weight of N-vinyl compound.

3. The method of making a permanent image comprising:

(a) providing reproduction material according to claim 1;

(b) image-wise exposing said material to actinic radiation, whereby a print-out image is formed; and (c) washing the exposed surface of said material with a solvent for the light-sensitive composition of said material, said solvent being a non-solvent for said print-out image, whereby unexposed areas of said composition are removed from said material.

References Cited

UNITED STATES PATENTS

| | | | |
|---|---|---|---|
| 3,042,517 | 7/1962 | Wainer | 96—48 |
| 3,109,736 | 11/1963 | Sprague | 96—48 |

NORMAN G. TORCHIN, Primary Examiner

J. R. HIGHTOWER, Assistant Examiner

U.S. Cl. X.R.

96—48

PO-1050
(5/69)

UNITED STATES PATENT OFFICE
CERTIFICATE OF CORRECTION

Patent No. 3,554,752 Dated 12 January 1971

Inventor(s) Ernst-August Hackmann, Roland Dietrich and Roland Moraw

It is certified that error appears in the above-identified patent and that said Letters Patent are hereby corrected as shown below:

Column 8, Line 52, after "compound" insert --selected from the group consisting of N-vinyl amines, N-vinyl amides and N-vinyl imides--.

Column 9, Lines 9 and 10, delete "selected from the group consisting of N-vinyl amines, N-vinyl amides and N-vinyl imides."

Signed and sealed this 13th day of April 1971.

(SEAL)
Attest:

EDWARD M.FLETCHER,JR.
Attesting Officer

WILLIAM E. SCHUYLER, JI
Commissioner of Patent: